US012680168B2

(12) United States Patent
Borude et al.

(10) Patent No.: US 12,680,168 B2
(45) Date of Patent: Jul. 14, 2026

(54) MULTIPLE-CHAMBER REACTOR FOR SELECTIVE DEPOSITION OF SILICON NITRIDE AND METHOD OF USING SAME

(71) Applicant: ASM IP Holding B.V., Almere (NL)

(72) Inventors: Ranjit Rohidas Borude, Hachioji (JP); Annisa Noorhidayati, Tama (JP); Agung Setiadi, Kokubunji (JP); Hideaki Fukuda, Hachioji (JP); Makoto Igarashi, Fuchu (JP)

(73) Assignee: ASM IP Holding B.V., Almere (NL)

( * ) Notice: Subject to any disclaimer, the term of this patent is extended or adjusted under 35 U.S.C. 154(b) by 34 days.

(21) Appl. No.: 18/806,917

(22) Filed: Aug. 16, 2024

(65) Prior Publication Data

US 2025/0066921 A1 Feb. 27, 2025

Related U.S. Application Data

(60) Provisional application No. 63/533,803, filed on Aug. 21, 2023.

(51) Int. Cl.
| | |
|---|---|
| *C23C 16/52* | (2006.01) |
| *C23C 16/34* | (2006.01) |
| *C23C 16/455* | (2006.01) |
| *C23C 16/56* | (2006.01) |
| *H01J 37/32* | (2006.01) |
| *H10P 14/60* | (2026.01) |
| *H10P 14/694* | (2026.01) |
| *H10P 72/00* | (2026.01) |

(52) U.S. Cl.
CPC ............ *C23C 16/52* (2013.01); *C23C 16/345* (2013.01); *C23C 16/45553* (2013.01); *C23C 16/56* (2013.01); *H01J 37/32449* (2013.01); *H01J 37/32899* (2013.01); *H10P 14/6336* (2026.01); *H10P 14/6339* (2026.01); *H10P 14/6532* (2026.01); *H10P 14/6538* (2026.01); *H10P 14/69433* (2026.01); *H10P 72/0436* (2026.01); *H01J 2237/3341* (2013.01); *H01J 2237/3346* (2013.01)

(58) Field of Classification Search
CPC ................ C23C 16/045; C23C 16/345; C23C 16/45538; C23C 16/45551; C23C 16/45553; C23C 16/52; C23C 16/54; C23C 16/56; H01J 37/32449; H01J 37/32899; H01J 2237/3341; H01J 2237/3346; H10P 14/6336; H10P 14/6339; H10P 14/6532; H10P 14/6538; H10P 14/69433; H10P 72/0436; H01L 21/0217; H01L 21/02274; H01L 21/0228; H01L 21/0234; H01L 21/02348; H01L 21/67115
See application file for complete search history.

(56) References Cited

U.S. PATENT DOCUMENTS

| | | | | |
|---|---|---|---|---|
| 2011/0256734 | A1* | 10/2011 | Hausmann | H10P 14/6339 |
| | | | | 257/E21.293 |
| 2017/0263437 | A1* | 9/2017 | Li | H10P 14/69433 |
| 2017/0342553 | A1 | 11/2017 | Yu | |

FOREIGN PATENT DOCUMENTS

| | | |
|---|---|---|
| WO | 2016178978 A1 | 11/2016 |
| WO | 2020167972 A1 | 8/2020 |

* cited by examiner

*Primary Examiner* — Benjamin Kendall
(74) *Attorney, Agent, or Firm* — Snell & Wilmer L.L.P.

(57) ABSTRACT

A method and system for depositing silicon using a multiple-chamber reactor are disclosed. An exemplary method includes performing one or more deposition cycles and performing a treatment, etch and/or cure process.

12 Claims, 13 Drawing Sheets

200

Provide substrate in first/third reaction chamber — 202

Deposit silicon nitride in first/third reaction chamber — 204

Move substrate to second/fourth reaction chamber — 206

Treat deposited silicon nitride in second/fourth reaction chamber — 208

1200

Provide substrate in first reaction chamber — 1202

Deposit silicon nitride — 1204

Move substrate to second reaction chamber — 1206

Cure deposited silicon nitride — 1208

(Topologically selectivity) etch cured silicon nitride — 1210

MULTIPLE-CHAMBER REACTOR FOR SELECTIVE DEPOSITION OF SILICON NITRIDE AND METHOD OF USING SAME

CROSS-REFERENCE TO RELATED APPLICATIONS

This application claims priority to U.S. Provisional Patent Application Ser. No. 63/533,803 filed Aug. 21, 2023 titled MULTIPLE-CHAMBER REACTOR FOR SELECTIVE DEPOSITION OF SILICON NITRIDE AND METHOD OF USING SAME, the disclosure of which is hereby incorporated by reference in its entirety.

FIELD OF INVENTION

The present disclosure generally relates to methods of depositing material and to structures including the deposited material. More particularly, the disclosure relates to methods of forming structures that include deposited silicon nitride and to structures including such material.

BACKGROUND OF THE DISCLOSURE

Silicon nitride films are used for a wide variety of applications. For example, silicon nitride films can be used to form insulating regions, etch stop regions, etch-resistant protective regions, and the like, on structures formed during the formation of electronic devices.

To form the regions or features including silicon nitride, a silicon nitride film is typically deposited onto a surface of a substrate. The deposited film is then patterned using, for example, photolithography, and then the film is etched to remove some of the silicon nitride to form desired features or areas including the remaining silicon nitride material. As device features continue to decrease in size, it becomes increasingly difficult to pattern and etch silicon nitride films to form features or areas of patterned silicon nitride of desired dimensions, particularly when it is desired to selectively deposit silicon nitride within a via or trench on a substrate surface. Additionally, lithography and etch steps can increase costs associated with device manufacturing and increase an amount of time required for device fabrication.

Recently, techniques have been developed to selectively form silicon nitride on a portion of the substrate surface. Such techniques often include chemically modifying a surface prior to deposition. While such techniques can work well for some applications, the techniques can introduce unwanted contamination on a substrate surface. Such processes can also increase a complexity of processes to form the structures. Further, such processes can be relatively time consuming, and therefore increase costs associated with such processes. Accordingly, improved methods for forming structures including silicon nitride are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to methods that can be used to selectively deposit or form silicon nitride on a surface of a substrate. While the ways in which various embodiments of the present disclosure address drawbacks of prior methods are discussed in more detail below, in general, various embodiments of the disclosure provide improved reactor systems for selectively depositing silicon nitride and improved methods of selectively forming silicon nitride on a surface or material on a substrate. As explained in more detail below, use of multiple-chamber reactor systems and corresponding methods can reduce contamination associated with deposition of silicon nitride, can provide deposited silicon nitride with desired properties, and/or can increase throughput associated with (e.g., selective) deposition of silicon nitride with desired properties and/or features.

In accordance with at least one embodiment of the disclosure, a multiple-chamber reactor system includes a first reaction chamber configured to deposit silicon nitride on a surface of a substrate to form deposited silicon nitride, a second reaction chamber configured to treat the deposited silicon nitride, and a controller configured to provide the substrate within the first reaction chamber, perform a deposition cycle in the first reaction chamber, move the substrate to the second reaction chamber, and perform a treatment process in the second reaction chamber. The deposition cycle can include pulsing a silicon precursor from a silicon precursor source to the first reaction chamber, providing a nitrogen-containing reactant from a nitrogen-containing reactant source to the first reaction chamber, and providing a deposition plasma power to form activated species from the nitrogen-containing reactant. The treatment process can include providing a hydrogen-containing reactant from a hydrogen reactant source to the second reaction chamber and providing a treatment plasma power to form activated species from the hydrogen-containing reactant. The multiple-chamber reactor system can be used to selectively deposit silicon nitride on a surface. The selective deposition can be topological, such that the silicon nitride is selectively deposited within a feature, such as a trench. Additionally or alternatively, the selective deposition can be material based, such that the silicon nitride is selectively deposited on a first material relative to a second material. In accordance with examples of these embodiments, the controller is configured to execute a plurality of the deposition cycles in the first reaction chamber prior to moving the substrate to the second reaction chamber. The controller can be further configured to move the substrate from the second reaction chamber to the first reaction chamber—e.g., for another deposition cycle. The multiple-chamber reactor system can further include a third reaction chamber configured to deposit additional silicon nitride on a surface of treated silicon nitride and a fourth reaction chamber configured to treat the additional silicon nitride. In such cases, the controller can be configured to move the substrate from the first reaction chamber to the second reaction chamber, from the second reaction chamber to the third reaction chamber, and from the third reaction chamber to the fourth reaction chamber to form selectively deposited silicon nitride. Alternatively, the controller can be configured to move substrates between the first and second reaction chambers and/or between the third and fourth reaction chambers to repeat deposition and treatment steps as described herein. Two or more (e.g., four) reaction chambers can form part of a process module.

In accordance with further exemplary embodiments of the disclosure, a method of depositing silicon nitride is provided. Exemplary methods include providing a substrate within a first reaction chamber, depositing silicon nitride on a surface of the substrate within the first reaction chamber to form deposited silicon nitride, moving the substrate to a second reaction chamber, and treating the deposited silicon nitride in the second reaction chamber to form treated silicon nitride. The first reaction chamber and the second reaction chamber can form part of a module. In accordance with examples of these embodiments, the step of treating includes selectively removing deposited silicon nitride. In accordance with further examples, a nitrogen-containing reactant is continuously supplied during one or more cycles comprising the steps of depositing silicon nitride and treating the deposited silicon nitride. In some cases, the silicon nitride can be conformally deposited. In some cases, the deposited silicon is initially flowable.

In accordance with further embodiments of the disclosure, a multiple-chamber reactor system includes a first reaction chamber configured to deposit silicon nitride on a surface of a substrate to form conformally deposited silicon nitride, a second reaction chamber configured to topologically selectively etch the conformally deposited silicon nitride, and a controller. A configuration of the first reaction chamber and the second reaction chamber can be substantially the same. In accordance with examples of these embodiments, the controller is configured to provide the substrate within the first reaction chamber, perform a deposition cycle in the first reaction chamber, move the substrate to the second reaction chamber, and perform a topologically selective etch process in the second reaction chamber. The deposition cycle can include pulsing a silicon precursor from a silicon precursor source to the first reaction chamber, providing a nitrogen-containing reactant from a nitrogen-containing reactant source to the first reaction chamber, and providing a deposition plasma power to form activated species from the nitrogen-containing reactant. In accordance with further examples, the topologically selective etch process includes providing a hydrogen and/or fluorine-containing reactant from a hydrogen and/or fluorine-reactant source and providing an etch plasma power to form activated species from the hydrogen and/or fluorine-containing reactant. In some cases, the activated species comprise fluorine radicals and hydrogen radicals. The multiple-chamber reactor system can include a third and a fourth reaction chamber, wherein the third and fourth reaction chambers are respectively the same or similar to the first and second reaction chambers. The controller can be configured to move a substrate between the first and second reaction chambers and/or between the first, second, third, and fourth reaction chambers.

In accordance with further examples of the disclosure, a multiple-chamber reactor system includes a first reaction chamber configured to deposit silicon nitride on a surface of a substrate to form deposited silicon nitride, a second reaction chamber configured to cure the deposited silicon nitride, and a controller. The controller can be configured to perform a deposition cycle in the first reaction chamber, move the substrate to the second reaction chamber, and perform a curing process in the second reaction chamber. In accordance with examples of these embodiments, the multiple-chamber reactor system includes a third reaction chamber configured to perform the etch process. Alternatively, in some cases, the etch process can be performed in the second reaction chamber.

In accordance with yet additional embodiments of the disclosure, a method of depositing silicon nitride includes providing a substrate within a first reaction chamber, depositing silicon nitride on a surface of the substrate within the first reaction chamber to form deposited silicon nitride, moving the substrate to a second reaction chamber, curing the deposited silicon nitride in the second reaction chamber to form cured silicon nitride, and etching a portion of cured silicon nitride to form selectively deposited silicon nitride. In accordance with examples of these embodiments, the step of etching is performed in the second reaction chamber. In accordance with further examples, the step of etching is performed in a third reaction chamber. In accordance with further examples, a temperature within the first reaction chamber during the step of depositing silicon nitride is less than 75° C. or is between 200° C. and 450° C. Additionally or alternatively, a temperature within the second reaction chamber during the step of curing silicon nitride is greater than 450° C., 500° C., 525° C., or 550° C.

In accordance with additional embodiments of the disclosure, a structure is provided. The structure can include a substrate, comprising a surface comprising a first material and a second material, and a silicon nitride layer selectively formed on the first material relative to the second material. The silicon nitride layer can be formed using a method described herein. Additionally or alternatively, the structure can include silicon nitride selectively formed within a feature on a substrate, such as within a gap, via, trench, or the like.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIGS. 8, 9, 10, and 13 illustrate structures in accordance with embodiments of the disclosure.

Figure 11:
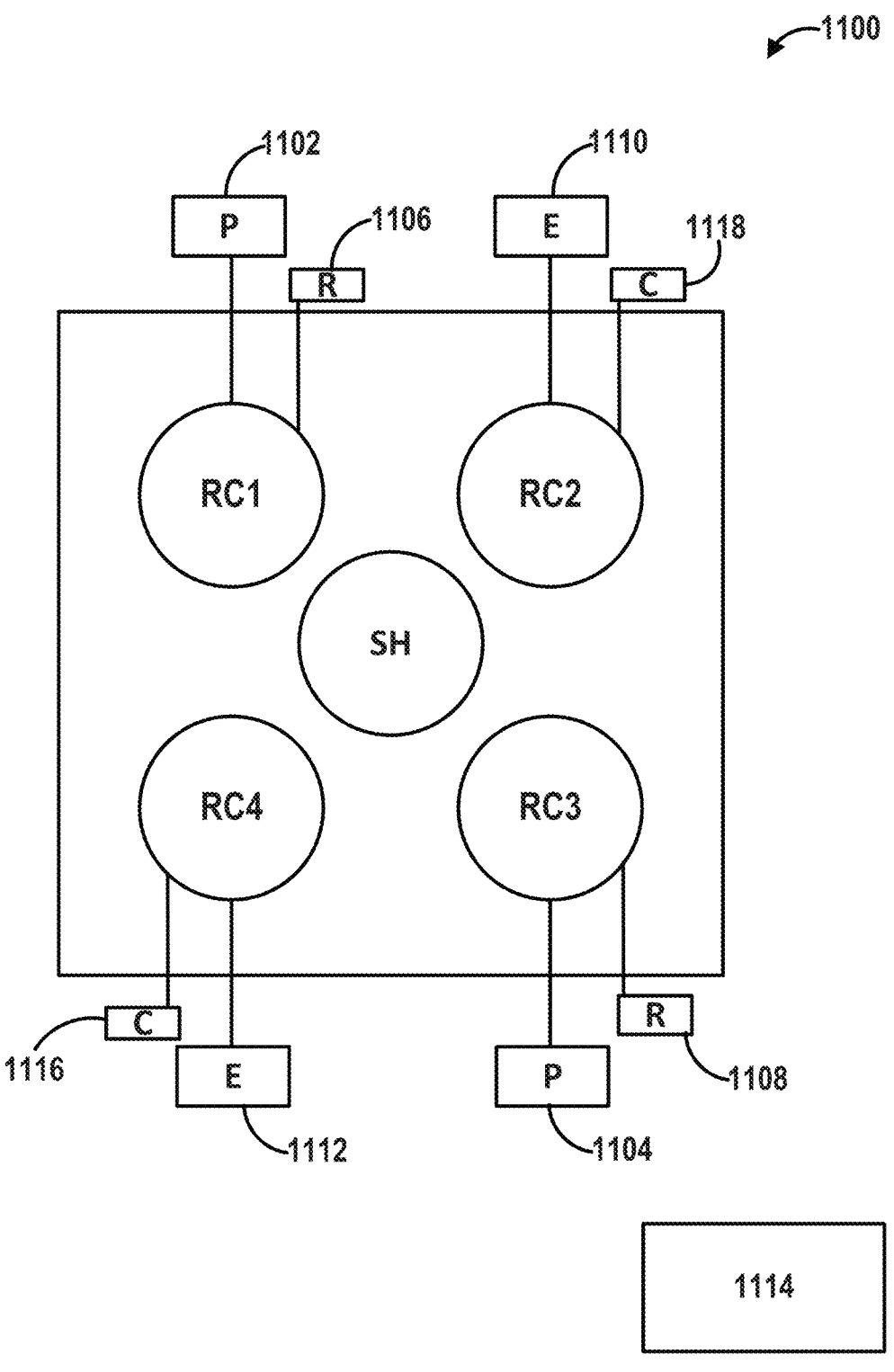

FIG. 11 illustrates yet another multiple-chamber reactor system in accordance with at least one embodiment of the disclosure.

Figure 12:
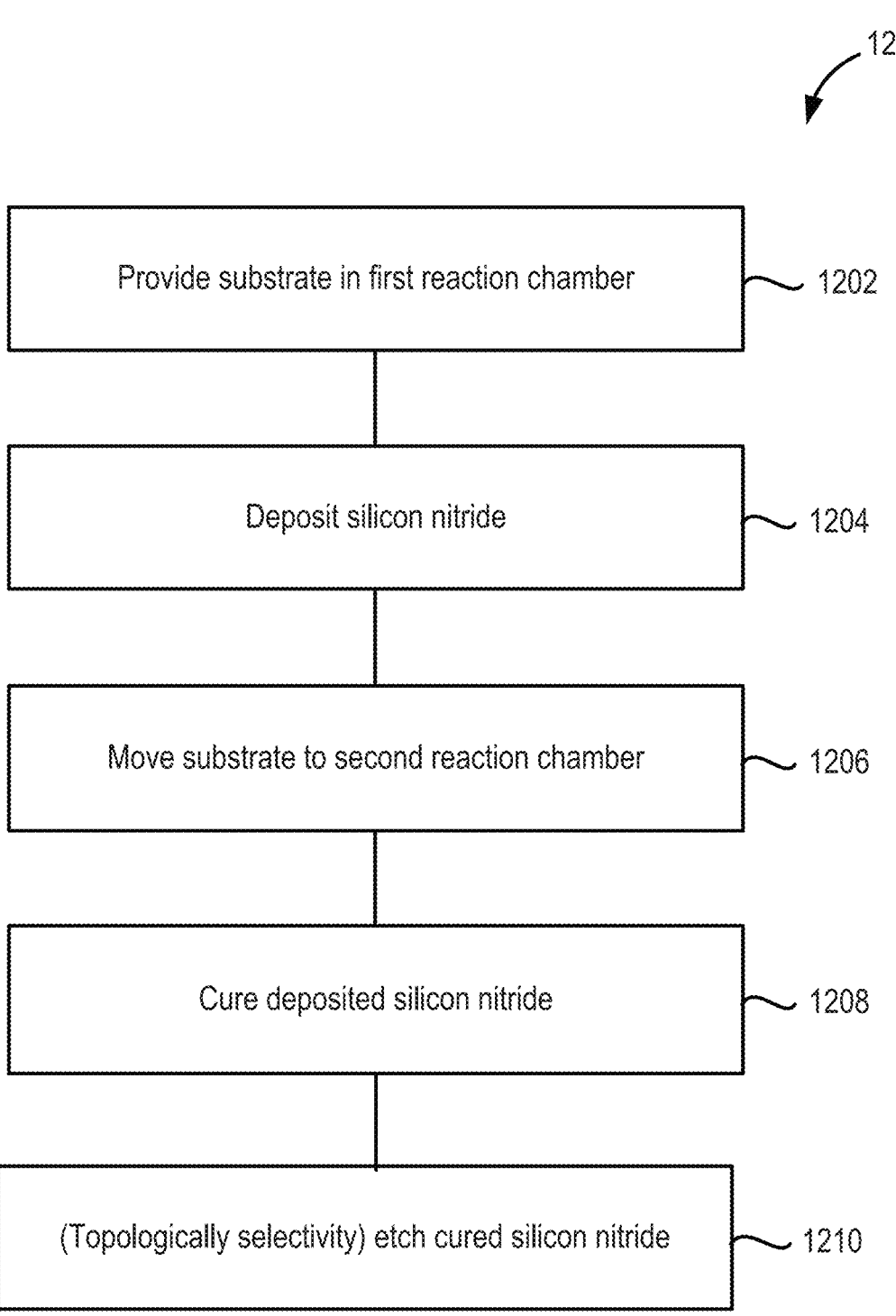

FIG. 12 illustrates another method in accordance with at least one embodiment of the disclosure.

Figure 14:
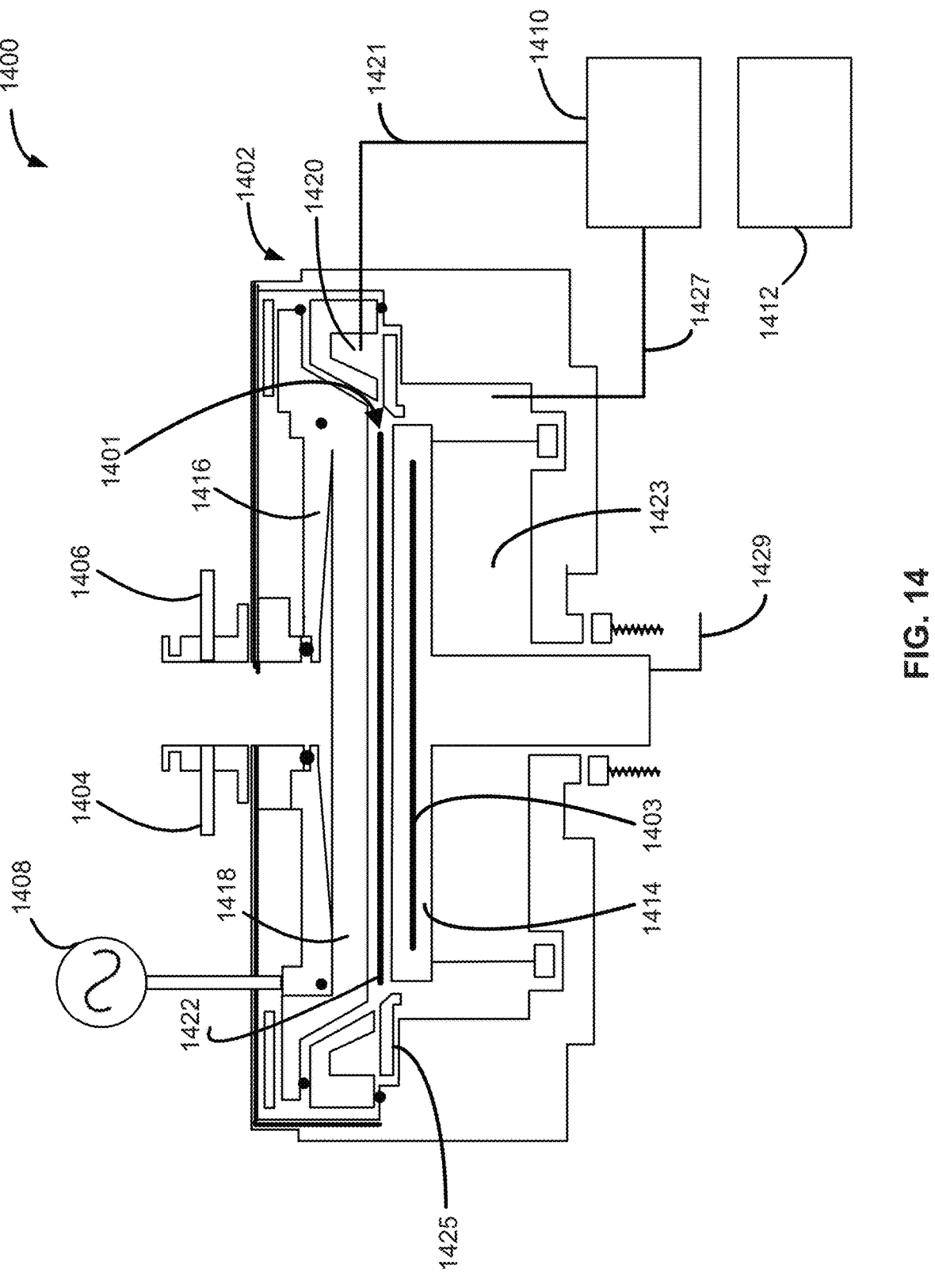

FIG. 14 illustrates a reaction chamber suitable for use in accordance with embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood that the invention extends beyond the specifically disclosed embodiments and/ or uses of the invention and obvious modifications and equivalents thereof. Thus, it is intended that the scope of the invention disclosed should not be limited by the particular disclosed embodiments described below.

Exemplary embodiments of the disclosure provide improved systems and methods for selectively depositing silicon nitride on a surface of a substrate. Exemplary systems and methods can be used to selectively deposit silicon nitride on a first material relative to a second material without employing an in-situ or ex-situ surface treatment before depositing the silicon nitride. Further, exemplary systems and methods can be used to deposit and treat silicon nitride in a single process module—e.g., without exposing a substrate to ambient conditions. Thus, any contamination of the surface that may otherwise result from performing the pre-deposition treatment and/or exposure to ambient conditions can be mitigated or avoided. Further, methods described herein can be used to selectively deposit silicon nitride in a relatively cost-effective and simple manner.

In this disclosure, a gas can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a noble gas. In some cases, the term precursor can refer to a compound that participates in the chemical reaction that produces another compound, and particularly to a compound that constitutes a film matrix or a main skeleton of a film. In some cases, the term reactant can be used interchangeably with the term precursor. The term inert gas can refer to a gas that does not take part in a chemical reaction and/or does not become a part of a film matrix to an appreciable extent. Exemplary inert gases include He, Ar, $H_2$, $N_2$ (e.g., when not activated by a plasma) and any combination thereof.

As used herein, the term substrate can refer to any underlying material or materials that may be used to form, or upon which, a device, a circuit, or a film may be formed. A substrate can include a bulk material, such as silicon (e.g., single-crystal silicon) and can include one or more layers overlying the bulk material. Further, the substrate can include various topologies, such as recesses, lines, and the like formed within or on at least a portion of a layer of the substrate. By way of examples, the substrate can include a surface comprising a first material and a second material, as described in more detail below.

As used herein, the term film and/or layer can refer to any continuous or non-continuous structures and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. Alternatively, a film or layer may consist entirely of isolated islands.

As used herein, the term cyclical deposition may refer to a process that includes sequential introduction of precursors and/or reactants into a reaction chamber and/or sequential plasma power pulses to deposit a layer over a substrate. Cyclical deposition processes include processing techniques, such as atomic layer deposition (ALD), cyclical chemical vapor deposition (CCVD), and plasma-enhanced ALD and CCVD.

As used herein, the term cyclical chemical vapor deposition may refer to any process wherein a substrate is sequentially exposed to two or more volatile precursors/ reactants, which react and/or decompose on a substrate to produce a desired deposition.

A layer including silicon nitride (SiN) can comprise, consist essentially of, or consist of silicon nitride material. Films consisting of silicon nitride can include an acceptable amount of impurities, such as carbon, chlorine or other halogen, and/or hydrogen, which may originate from one or more precursors used to deposit the silicon nitride layers. As used herein, SiN or silicon nitride refers to a compound that includes silicon and nitrogen. SiN can be represented as $SiN_x$, where x varies from, for example, about 0.5 to about 2.0, where some Si—N bonds are formed. In some cases, x may vary from about 0.9 to about 1.7, from about 1.0 to about 1.5, or from about 1.2 to about 1.4. In some embodiments, silicon nitride is formed where Si has an oxidation state of +IV and the amount of nitride in the material may vary. Silicon nitride can include silicon carbon nitride (SiCN), which includes silicon carbon and nitrogen.

As used herein, a structure can include a substrate as described herein. Structures can include one or more layers overlying the substrate, such as one or more layers formed according to a method as described herein.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms including, constituted by and having can refer independently to typically or broadly comprising, comprising, consisting essentially of, or consisting of in some embodiments. It shall be understood that when a composition, method, device, or the like is said to comprise certain features, it means that it includes those features, and that it does not necessarily exclude the presence of other features, as long as they do not render the claim unworkable. This notwithstanding, the term comprises or includes or has includes the meaning of consists of, i.e., the case when the composition, method, device, or the like in question only includes the features, components, and/or steps that are listed, and does not contain any other features, components, steps, and the like, and includes consisting essentially of.

In this disclosure, any defined meanings do not necessarily exclude ordinary and customary meanings in some embodiments.

Figure 1:
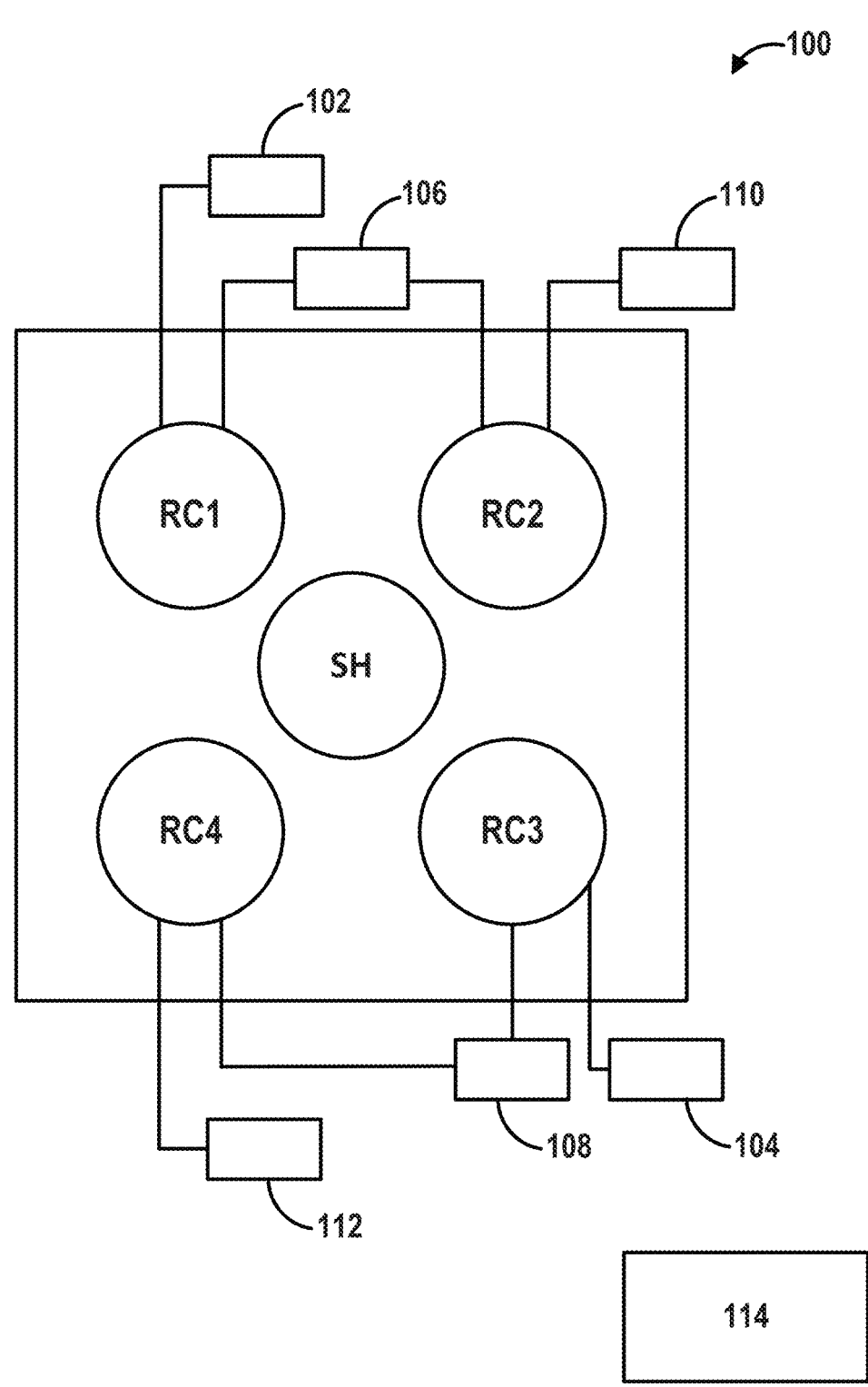
FIG. 1 illustrates a multiple-chamber reactor system in accordance with at least one embodiment of the disclosure.

Turning now to the figures, FIG. 1 illustrates a multiple-chamber reactor system 100 in accordance with embodiments of the disclosure. In the illustrated example, multiple-chamber reactor system 100 includes a first reaction chamber RC1, a second reaction chamber RC2, a third reaction chamber RC3, and a fourth reaction chamber RC4. A configuration of RC1-RC4 can vary according to desired processes. An exemplary reaction chamber suitable for use as one or more of RC1-RC4 is described in more detail below in connection with FIG. 14.

In accordance with examples of the disclosure, at least one of RC1-RC4 is configured to deposit silicon nitride on a surface of a substrate to form deposited silicon nitride. By way of examples, RC1 and RC3 can be configured to deposit silicon nitride on a surface of the substrate.

In accordance with further examples of the disclosure, at least one of RC1-RC4 is configured to treat the deposited silicon nitride. For example, RC2 and/or RC4 can be configured to treat the deposited silicon nitride.

Multiple-chamber reactor system 100 can also include a substrate handler SH configured to move substrates between two or more reaction chambers RC1-RC4. For example, substrate handle SH (and a controller 114) can be configured to move a substrate between RC1, RC2, RC3, and RC4 and optionally repeat. In these cases, third reaction chamber RC3 can be configured to deposit additional silicon nitride on a surface of treated silicon nitride and RC4 can be configured to treat the additional silicon nitride. Additionally or alternatively, substrate handler SH (and controller 114) can move substrates between RC1 and RC2 and repeat and/or between RC3 and RC4 and repeat.

Multiple-chamber reactor system 100 can also include a silicon precursor source 102, 104 coupled to, for example, RC1 and/or RC2. Each silicon precursor source 102, 104 includes a vessel and a silicon precursor therein. Exemplary suitable silicon precursors are set forth below. Although separately illustrated, silicon precursor source 102, 104 can be a single precursor source.

Multiple-chamber reactor system 100 can also include a nitrogen-containing reactant source 106, 108 coupled to one or more reaction chambers RC1, RC2. Nitrogen-containing reactant source 106, 108 can be a single source or multiple sources coupled to one or more of RC1-RC4. Each nitrogen-containing reactant source 106, 108 includes a vessel and a nitrogen-containing reactant. Exemplary nitrogen-containing reactants as also set forth below.

Multiple-chamber reactor system 100 can also include one or more treatment reactant sources 110, 112. Treatment reactant sources 110, 112 can include a vessel and a treatment reactant therein. Exemplary treatment reactants include a hydrogen-containing reactant, such as hydrogen ($H_2$), hydrogen containing halides, $NH_3$, mixture of any combination of $N_2/Ar/He$—$H_2$.

Controller 114 can be configured to move substrates within multiple-chamber reactor system 100 and to effectuate deposition and treatment processes as described herein. For example, controller 114 can be configured to provide the substrate within the first reaction chamber, perform a deposition cycle in the first reaction chamber, move the substrate to the second reaction chamber, and perform a treatment process in the second reaction chamber. By way of particular example, controller 114 can be configured to perform a deposition cycle in the first reaction chamber, wherein the deposition cycle comprises pulsing a silicon precursor from silicon precursor source 102 to first reaction chamber RC1, providing the nitrogen-containing reactant from nitrogen-containing reactant source 106 to first reaction chamber RC1, and providing a deposition plasma power to form activated species from the nitrogen-containing reactant. Additionally or alternatively, controller 114 can be configured to perform a treatment process in second reaction chamber RC2, wherein the treatment process comprises providing a hydrogen-containing reactant from hydrogen/treatment reactant source 110 to second reaction chamber RC2 and providing a treatment plasma power to form activated species from the hydrogen-containing reactant. In accordance with examples of these embodiments, controller 114 is configured to execute a plurality of the deposition cycles (e.g., between about 1 and about 500 or between about 1 and 300) in first reaction chamber RC1 prior to moving the substrate to second reaction chamber RC2. In some cases, the controller is further configured to move the substrate from second reaction chamber RC2 to first reaction chamber RC1.

In accordance with further examples of the disclosure, controller 114 is further configured to ramp up a flow of the hydrogen-containing reactant after the substrate is within the second reaction chamber. Controller 114 can be further configured to ramp down the flow of the hydrogen-containing reactant before the substrate is removed from the second reaction chamber. One or both of the ramp rates may be relatively constant.

Figure 2:
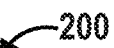
FIG. 2 illustrates a method in accordance with at least one embodiment of the disclosure.

FIG. 2 illustrates a method 200 of depositing silicon nitride in accordance with additional embodiments of the disclosure. Method 200 can be used for selectively depositing silicon nitride on a first material of a substrate surface relative to a second material on the substrate surface.

A selective deposition process as described herein can include depositing a greater amount of material on a first material relative to a second material on the substrate surface. For example, a selective process may result in a greater amount of silicon nitride formed on the first material relative to any silicon nitride formed on the second material. In some embodiments of the disclosure, a selectivity of a process can be expressed as a ratio of material deposited (e.g., a layer thickness) on the first material relative to the amount of material (e.g., a layer thickness) formed on the first and second materials combined. For example, if 10 nm of silicon nitride is deposited on the first material and 1 nm of silicon nitride is deposited on the second material, the selective deposition process will be considered to have 91% selectivity. In some embodiments, the selectivity of the methods disclosed herein is greater than 50%, greater than 75%, greater than 80%, greater than 90%, greater than 95%, greater than 98%, greater than 99%, or even about 100%.

Method 200 includes the steps of providing a substrate within a reaction chamber (step 202), depositing silicon nitride on the surface of the substrate within the first reaction chamber to form deposited silicon nitride (step 204), moving the substrate to a second reaction chamber (step 206), and treating the deposited silicon nitride in the second reaction chamber to form treated silicon nitride (step 208).

During step 202, a substrate is provided into a reaction chamber of a reactor. Optionally, a reactor including the reaction chamber can be provided with a heater to activate the reactions by elevating the temperature of one or more of the substrate and/or the reactants/precursors.

During step 202, the substrate can be brought to a desired temperature and pressure for step 204. By way of examples, a temperature (e.g., of a substrate or a substrate support) within a reaction chamber can be between about 100° C. and about 600° C. or about 300° C. and about 550° C. A pressure within the reaction chamber can be about 0.5 to about 50 or about 1 to about 30 Torr.

As noted above, the substrate provided during step 202 includes a surface comprising a first material and a second material. The first material can include, for example, silicon or a nitride, such as silicon nitride. The second material can include an oxide, such as a metal oxide or silicon oxide or a metal. For example, the second material can include a metal oxide, such as a transition metal oxide, such as hafnium oxide.

During step 204, one or more deposition cycles are performed to (e.g., selectively) deposit silicon nitride on the surface of the substrate. In some cases, the deposited silicon nitride is initially flowable.

Figure 3:
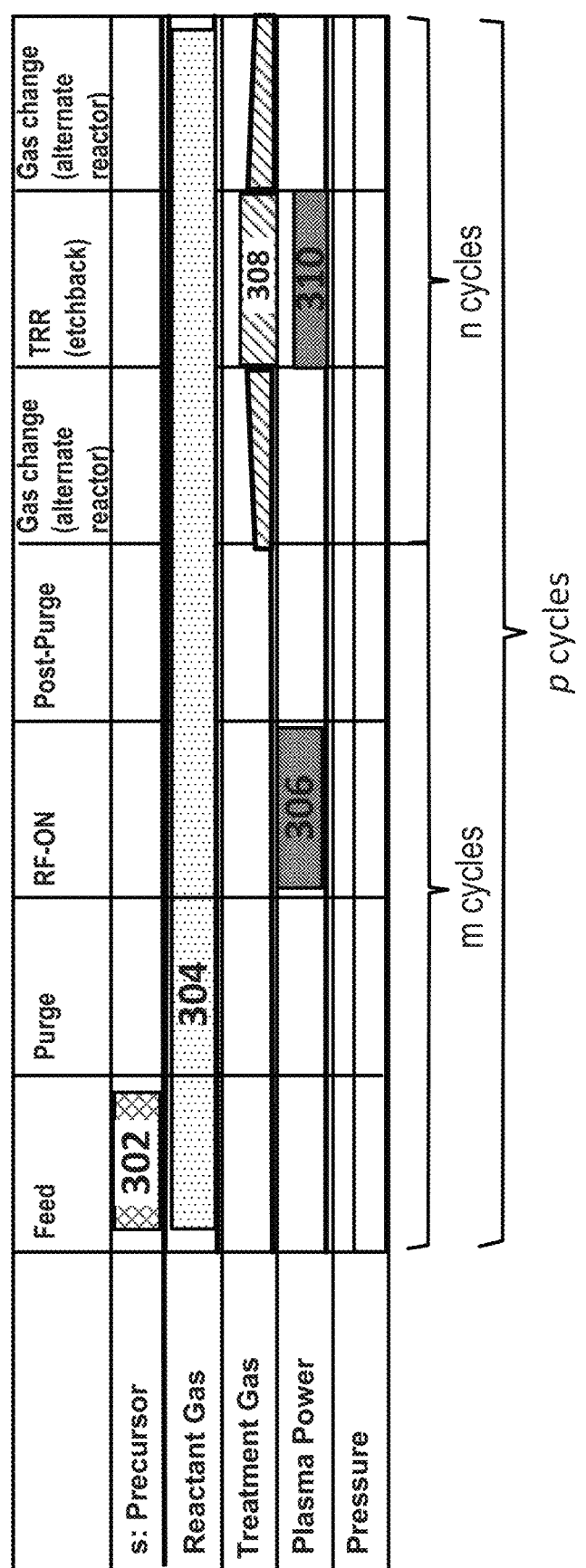
FIG. 3 illustrates a timing sequence in accordance with at least one embodiment of the disclosure.

FIG. 3 illustrates an exemplary timing sequence 300 suitable for use with or as step 204. Timing sequence 300 includes deposition cycles m, treatment cycles n, and overall cycles p. As illustrated, each deposition cycle m can include pulsing or providing a silicon precursor to the reaction chamber for a precursor pulse period (step 302), providing a reactant gas to the reaction chamber (step 304), and providing a deposition plasma power for a deposition plasma period to form activated species from the reactant gas (step 306).

During step 302, the silicon precursor is pulsed to the reaction chamber. Exemplary silicon precursors suitable for use with step 302/204 include silicon precursors that preferentially react with OH terminal groups on a surface of a substrate. Such silicon precursors include silanes, silylamines, and aminosilanes. Particular examples include silane ($SiH_4$), disilane ($Si_2H_6$), trisilane ($Si_3H_8$), tetrasilane ($Si_4H_{10}$), $N(Si_2H_5)_3$, trisilylamine $N(SiH_3)_3$, $N(SiMe_3)(SiH\text{-}MeNMe_2)_2$, 2,2-disilyltrisilane ($Si(SiH3)_4$), trisdimethylaminosilane ($SiH(NMe_2)_3$), bis(diethylamino)silane ($SiH_2(NEt_2)_2$) (BEDAS), bis(tert-butylamino)silane ($SiH2(NHtBu)_2$) (BTBAS), di-isopropylamido)silane ($SiH_3(NiPr_2)$) (DIPAS), where Me represents a methyl group, Et represents an ethyl group, tBu represents a tert-butyl group, and iPr represents an isopropyl group. Alternatively, some precursors may preferentially react with activated cites comprising —NH terminal bonds. Exemplary precursors that react with such activated cites include halogenated silicon compounds, such as silicon compounds comprising one or more of Cl and I. Particular examples include trichloro disilane ($Si_2Cl_3H_3$), pentachloro disilane ($Si_2Cl_5H$), hexachloro disilane ($Si_2Cl_6$), octachlorotrisilane ($Si_3Cl_8$), dechloro silane ($SiCl_2H_2$), dimethyldichlorosilane ($SiCl_2Me_2$), tetrachloro silane ($SiCl_4$), tetraiodo silane ($SiI_4$), triiodo silane ($SiI_3H$), and deiodo silane ($SiI_2H_2$).

A flowrate of the silicon precursor with a carrier gas to the reaction chamber during step 302 can be about 200 to about 10000 or about 2000 to about 4000 sccm. A duration of the silicon precursor pulse can be between about 0.01 second to 60 seconds, 0.1 seconds to 60 seconds and 0.1 to 20 seconds.

During step 304, a nitrogen-containing reactant is provided to the reaction chamber. Exemplary nitrogen-containing reactants include one or more of nitrogen ($N_2$), $NH_3$, $N_2$—$H_2$ or the like, alone or in combination with one or more of argon (Ar), helium (He), or the like in any combination.

A flowrate of the nitrogen-containing reactant to the reaction chamber during step 304 can be about 1000 to about 50000 or about 10000 to about 30000 sccm. A duration of a reactant pulse can be between about 1 and about 30 seconds or between about 2 and about 10 seconds and/or as illustrated, can be continuous through one or more deposition cycles and/or through one or more deposition and treatment cycles p.

During step 306, a deposition plasma power is provided for a deposition plasma period to form activated species from the reactant gas. The deposition plasma power can have a frequency of between about 100 kHz and about 60 MHz and/or between about 12 MHz and about 14 MHz. The deposition plasma power can have a power of between about 10 and about 2000 W or between about 100 and about 900 W or be about 30 W to about 500 W for a 300 mm diameter substrate or have similar power densities for substrates of different cross-sectional dimensions, and particularly for a CCP process. Power levels may be higher for an IPC process. A duration of step 306 can be between about 0.05 seconds and about 60 seconds or between about 0.5 seconds and about 30 seconds.

During the transition period—i.e., a period after the one or more m deposition cycles of step 204 and before the treatment process of step 108—one or more gas flowrates and/or a reaction chamber pressure can be adjusted for subsequent steps. Additionally or alternatively, a pressure within the reaction chamber during the transition period can decrease. Yet further additionally or alternatively, a flowrate of the treatment gas to the reaction chamber can increase during the transition period.

With reference again to FIG. 2, once a desired amount of silicon nitride is (e.g., selectively) deposited, the substrate is moved to a second reaction chamber (e.g., RC2) during step 206. The substrate can be moved between reaction chambers using the substrate handler SH and/or controller 114 as described above. The reaction chambers (e.g., RC1-RC4 as described above) can form part of a module.

During step 208, a treatment process is performed. The treatment process includes treating the deposited silicon nitride in the second reaction chamber to form treated silicon nitride. In accordance with examples of these embodiments, step 208 of treating comprises selectively removing deposited silicon nitride.

With reference to FIG. 3 and timing sequence 300, an exemplary treatment step 208 includes providing a treatment gas to the reaction chamber (step 308) and providing a treatment plasma power for a treatment plasma period to form activated species from the treatment gas (step 310).

A temperature within the reaction chamber (e.g., of a susceptor within the reaction chamber) during step 208 can be as noted above in connection with step 202 or higher, e.g., about 50° C. to about 600° C., about 200° C. to about 450° C., or about 400° C. to about 550° C. A pressure within the reaction chamber during step 208 can be between about 1 Torr and about 30 Torr or between about 2.6 Torr and about 15 Torr.

In accordance with examples of the disclosure, a pressure within the reaction chamber during performing one or more deposition cycles, step 204, is greater than a pressure within the reaction chamber during performing the treatment process, step 208. For example, the pressure within the reaction chamber during performing one or more deposition cycles can be at least 2.5 or 10 times greater than the pressure within the reaction chamber during performing the treatment process.

The treatment gas used during step 208/308 can include a hydrogen-containing reactant. Exemplary hydrogen-containing reactants are noted above. A flowrate of the treatment gas during performing the treatment process step 208/308 can be between about 0.1 and about 2 slm or be between about 0.5 and about 1 slm. As illustrated, timing sequence 300 can include ramping up (e.g., at a controlled and/or substantially constant rate) and/or ramping down the flow rate. The ramping up can occur after step 206 is completed and the step of ramping down can occur before a substrate is transferred from RC2—e.g., to RC1, RC3, or another location.

During step 310, a treatment plasma power is provided for a treatment plasma period to form activated species from the treatment gas. The treatment plasma power can have a frequency of between about 100 kHz and about 60 MHz and/or between about 12 MHz and about 14 MHz. The treatment plasma power can have a power of between about 10 and about 2000 W or between about 100 and about 900 W or be about 600 W for a 300 mm diameter substrate or have similar power densities for substrates of different cross-sectional dimensions. A duration of step 118 can be between about 0.05 seconds and about 300 seconds or between about 0.5 seconds and about 60 seconds. In accordance with examples of the disclosure, the deposition plasma power provided during step 306 is greater than the treatment plasma power provided during step 310. In accordance with further examples, a duration of the deposition plasma period is less than a duration of the treatment plasma period. For example, the deposition plasma period can be less than 50%, less than 25%, less than 20%, or less than 16% of the duration of the treatment plasma period.

As illustrated in FIG. 2, steps 204-208 can be repeated a number of times to selectively deposit silicon nitride on the first material relative to the second material. Further, as noted above, step 204 can be repeated a number of times prior to proceeding to step 206 or 208.

Figure 4:
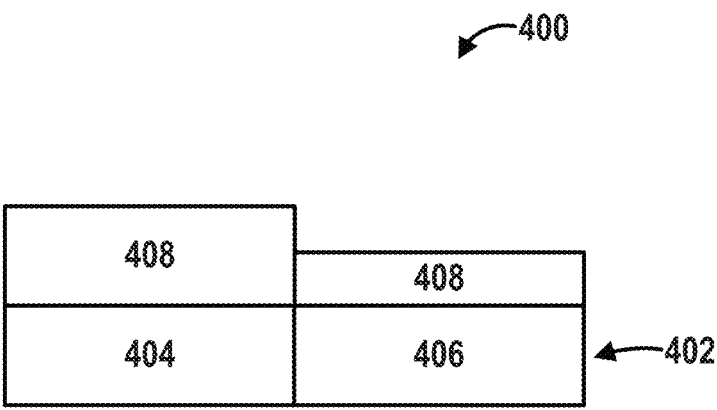
FIGS. 4 and 5 illustrate structures in accordance with embodiments of the disclosure.

FIG. 4 illustrates a structure 400 in accordance with exemplary embodiments of the disclosure. Structure 400 includes a substrate 402, including a first material 404 and a second material 406. As illustrated, first material 404 and second material 406 are formed on a surface of substrate 402. Although illustrated with a horizontal surface, the substrate surface can additionally or alternatively include a vertical surface and first material 404 and second material 406 can be vertically oriented with respect to each other.

Substrate 402 can include any suitable material, such as semiconductor material and materials typically used to form semiconductor devices. By way of example, substrate 402 can be or include silicon, other Group IV semiconductor material, a Group III-V semiconductor, and/or a Group II-VI semiconductor.

First material 404 can include any of the first materials noted above. For example, first material 404 can include a silicon-containing material, such as silicon or silicon nitride. Similarly, second material 406 can include any of the second materials noted herein. By way of examples, second material 406 can include a metal or an oxide, such as an elemental metal or alloy, a metal oxide (e.g., $HfO_2$, $ZrO_2$, or the like), or silicon oxide (which may include carbon and/or nitrogen).

Structure 400 also includes silicon nitride 408, which has been selectively deposited over (e.g., in direct contact with) first material 404, relative to silicon nitride 408 deposited over (e.g., in direct contact with) second material 406 using a method and/or system as described herein. In the illustrated example, the selectivity is not 100%, but rather an amount of silicon nitride 408 can be formed overlying second material 406. In other cases, the selectivity may be 100% or as described above.

Figure 5:
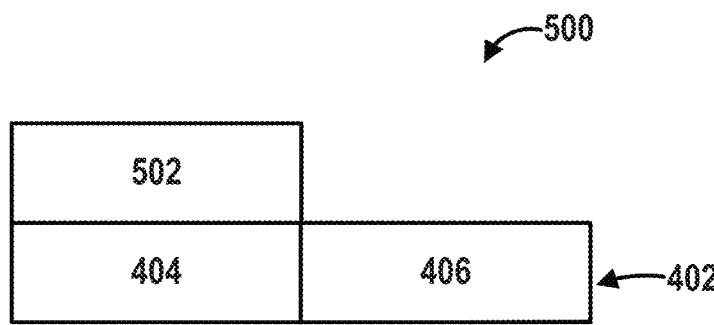

FIG. 5 illustrates a structure 500 after structure 400 is exposed to a treatment process as described herein. As illustrated, structure 500 includes less—e.g., a trace or unmeasurable amount of silicon nitride on second material 406 and remaining/treated silicon nitride 502 overlying material 404.

Figure 6:
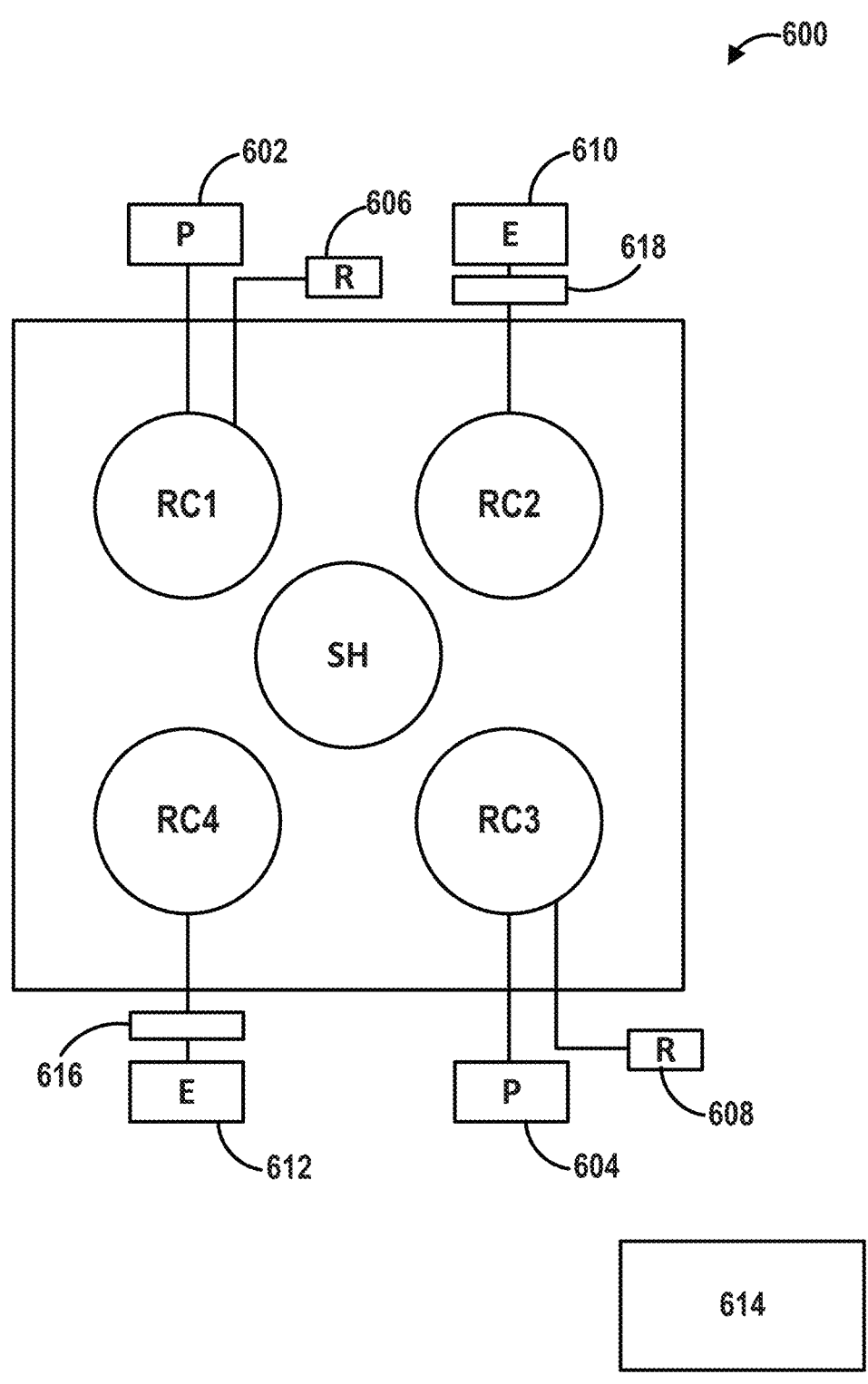
FIG. 6 illustrates another multiple-chamber reactor system in accordance with at least one embodiment of the disclosure.

FIG. 6 illustrates another multiple-chamber reactor system 600 in accordance with examples of the disclosure. Multiple-chamber reactor system 600 can be similar to multiple-chamber reactor system 100 described above, except multiple-chamber reactor system 600 includes at least one reaction chamber configured to perform an etch step.

In the illustrated example, multiple-chamber reactor system 600 includes four reaction chambers RC1-RC4 and a substrate handler SH. Substrate handler SH can be as described above. Reaction chambers RC1-RC4 can be the same or similar to RC1-RC4 described above in connection with FIG. 1.

Multiple-chamber reactor system 600 can be used to deposit silicon nitride to, for example, fill a recess on a substrate surface. In accordance with examples of the illustrated embodiments, multiple-chamber reactor system 600 includes one or more reaction chambers of RC1-RC4 configured to deposit silicon nitride on a surface of a substrate to form conformally deposited silicon nitride and one configured to topologically selectively etch the conformally deposited silicon nitride. For example, RC1 and RC3 can be configured for deposition of silicon nitride and RC2 and RC4 can be configured for selective etching. Use of multiple-chamber reactor system 600 allows for seamless filing of high aspect ratio features (e.g., recesses having an aspect ratio of 0.5 or more or between 0.5 and 20.

Multiple-chamber reactor system 600 can further include a precursor source 602, 604 and/or a reactant source 606, 608 coupled to one or more reaction chambers, such as RC1 and RC3. Precursor source 602, 604 can be a silicon precursor source as described above. Similarly, reactant source 606, 608 can be a nitrogen-containing reactant source as described above.

Multiple-chamber reactor system 600 can further include an etch source 610, 612. Although illustrated as a single source, etch source 610, 612 can include more than one compound in one or more vessels. In accordance with examples of the disclosure, etch source 610, 612 includes a hydrogen and a halogen compound, which may comprise one or more compounds. For example, etch source 610, 612 can include a vessel and one or more of $CxFy$, $NF_3$, contained within the vessel or multiple vessels.

As illustrated, multiple-chamber reactor system 600 can further include one or more (e.g., 2) remote plasma units 616, 618. The remote plasma units can be configured to provide radicals derived from one or more etchants. By way of particular examples, remote plasma units 616, 618 can form hydrogen and halogen (e.g., fluorine) radicals from the one or more etchants. Additionally or alternatively, the reaction chamber configured to topologically selectively etch the conformally deposited silicon nitride can include a direct plasma apparatus as described below in connection with FIG. 14.

In accordance with further examples of the disclosure, controller 614 is configured to provide the substrate within the first reaction chamber (e.g., using substrate handler SH), perform a deposition cycle in a first reaction chamber (e.g., RC1), move the substrate to the second reaction chamber (e.g., RC2), and perform a topologically selective etch process in the second reaction chamber. In accordance with further exemplary embodiments, one or more of RC2, RC3, and/or RC4 can be used to perform a treatment step as described herein.

By way of examples, controller 614 can be configured to pulse a silicon precursor from a silicon precursor source to the first reaction chamber, provide a nitrogen-containing reactant from a nitrogen-containing reactant source to the first reaction chamber, and provide a deposition plasma power to form activated species from the nitrogen-containing reactant as described above. In the illustrated example, such a process can be performed in RC1 and/or RC3.

The topologically selective etch process can be performed by, for example, providing a hydrogen and/or fluorine-containing reactant from a hydrogen and/or fluorine-reactant source and providing an etch plasma power to form activated species from the hydrogen and/or fluorine-containing reactant.

In accordance with various examples of these embodiments, the reaction chambers configured to perform a deposition cycle in the first reaction chamber can operate at a relatively low temperature, such as a temperature of about 200° C. to about 450° C. for ALD, or about 40° C. to about 150° C. for flowable deposition. In such cases, the reaction chamber can include, for example, an aluminum susceptor. In accordance with further examples, the reaction chamber configured to perform the topologically selective etch process can be configured to operate at a relatively high temperature, such as a temperature of about 50° C. to about 200° C. or about 150° C. to about 450° C. In some cases, the reaction chambers can be configured to be substantially the same, such that all reaction chambers of multiple-chamber reactor system 600 can operate at the highest temperatures.

Figure 7:
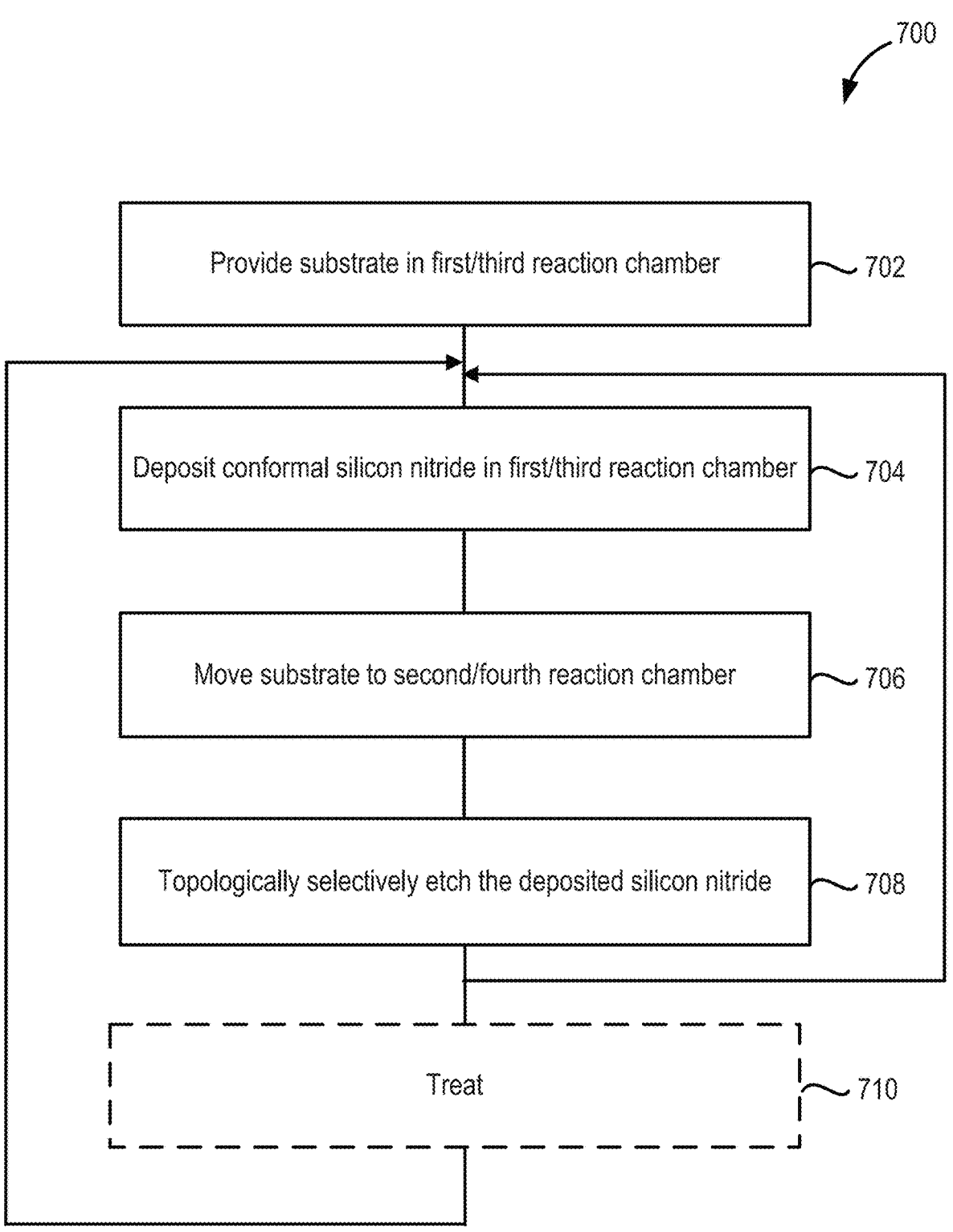
FIG. 7 illustrates another method in accordance with at least one embodiment of the disclosure.
Figure 8:
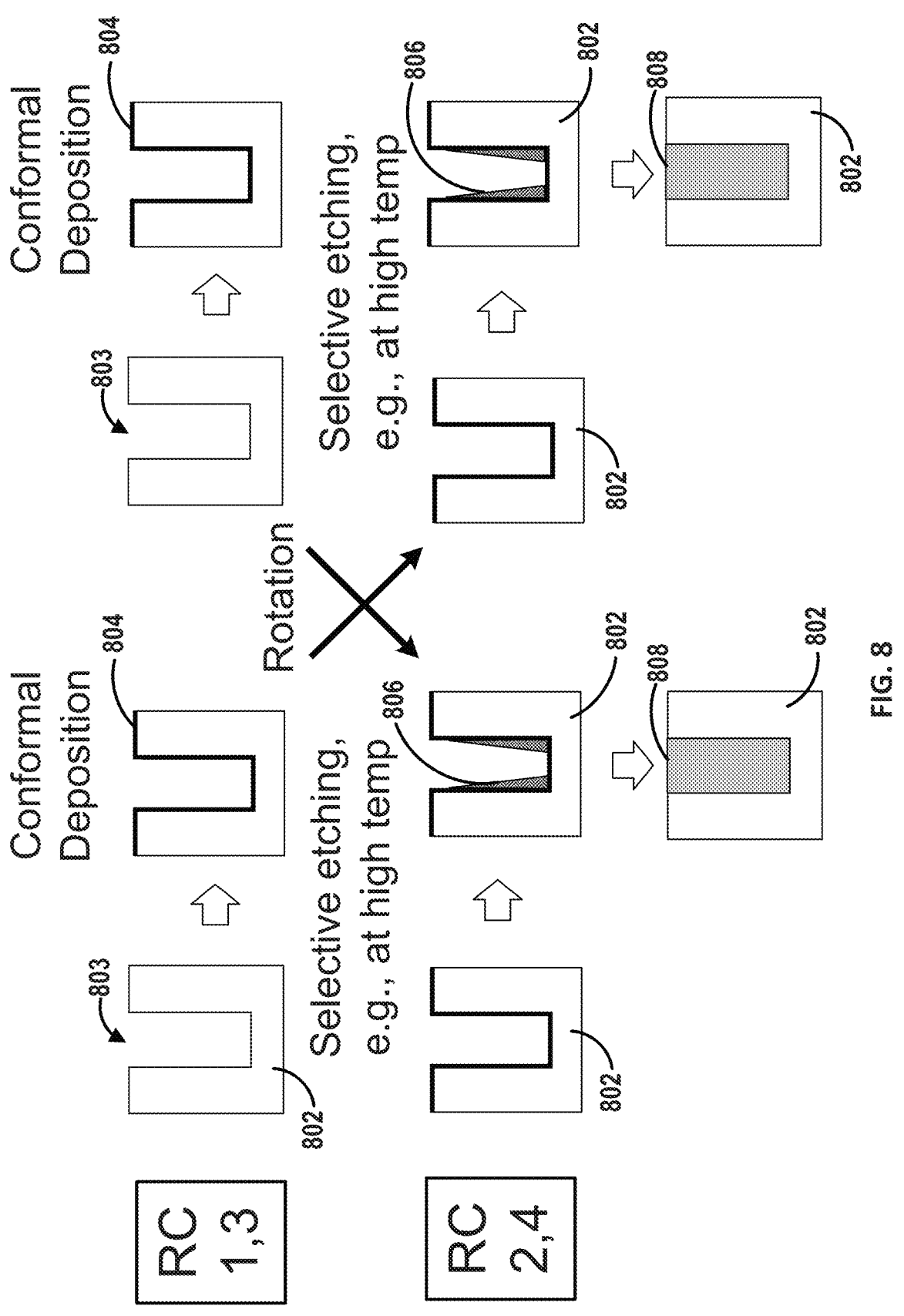

FIG. 7 illustrates a method 700 of depositing silicon nitride in accordance with embodiments of the disclosure. Method 700 includes the steps of providing a substrate (e.g., substrate 802) within a reaction chamber (e.g., within RC1 or RC3) (step 702), depositing conformal silicon nitride (step 704), moving the substrate to another reaction chamber (e.g., RC2 or RC4) (step 706), and topologically selectively etching the silicon nitride (step 708). As illustrated, method 700 can also optionally include a treatment step.

Step 702 can be the same or similar to step 202 described above. For example, step 702 can include using substrate handler SH to place a substrate 802 (illustrated in FIG. 8) within RC. Step 702 can also include bringing the reaction chamber (e.g., RC1) to a temperature and pressure as described above in connection with step 202. As illustrated, substrate 802 can include a feature 803, such as a recess.

Once the reaction chamber is at the desired temperature and pressure, silicon nitride 804 can be (e.g., conformally) deposited during step 704—e.g., as described above in connection with step 204.

Once a desired amount of silicon nitride is deposited, during step 706, the substrate is moved to another reaction chamber (e.g., RC2) to perform a topologically selective etch process 708. During step 708, silicon nitride is topologically selectively removed near a top of a feature, relative to a bottom of the feature—e.g., to form topologically selectively etched silicon nitride 806. Topologically selective etch step 708 can include heating the substrate to a temperature as noted above in connection with a topologically selective etch step. Topologically selective etch step 708 can include forming activated species comprising fluorine radicals and/or hydrogen radicals using a direct and/or remote plasma apparatus. A pressure within the reaction chamber during step 708 can be between about 4 and about 50 PA or between about 40 and about 400 Pa. A duration of step 708 can be between about 1 and about 60 seconds or between about 5 and about 20 seconds.

As further illustrated, after one or more cycles of steps 704-708 have been completed, the silicon nitride can be treated during step 710. Such treatment can occur in one or more of RC1-RC4 or in another reaction chamber. Step 710 can be the same or similar to step 208 described above in connection with FIG. 2.

Steps 704-708 and/or steps 704-710 can be repeated until feature 803 is filled with silicon nitride 808, which may be treated or untreated.

Figure 9:
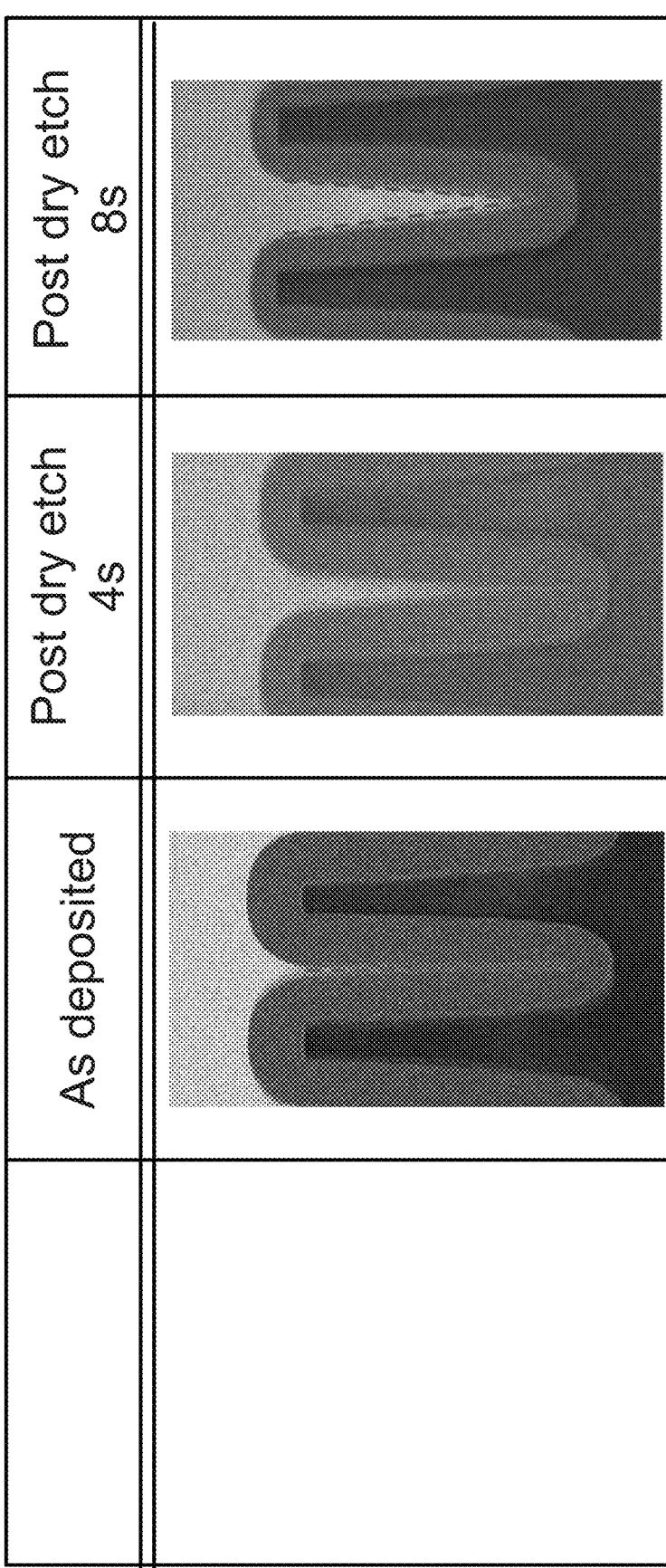

FIG. 9 illustrates scanning transmission electron microscopy (STEM) images of structures formed using method 700. As illustrated, as-deposited silicon nitride can be conformally deposited. The conformally-deposited silicon nitride may begin to form a seam where the layer of silicon nitride meets within the feature/recess. After an etch step, the silicon nitride is preferentially etched near a top of the feature, relative to a bottom of the feature, allowing a void-free and seam-free fill of the feature.

Figure 10:
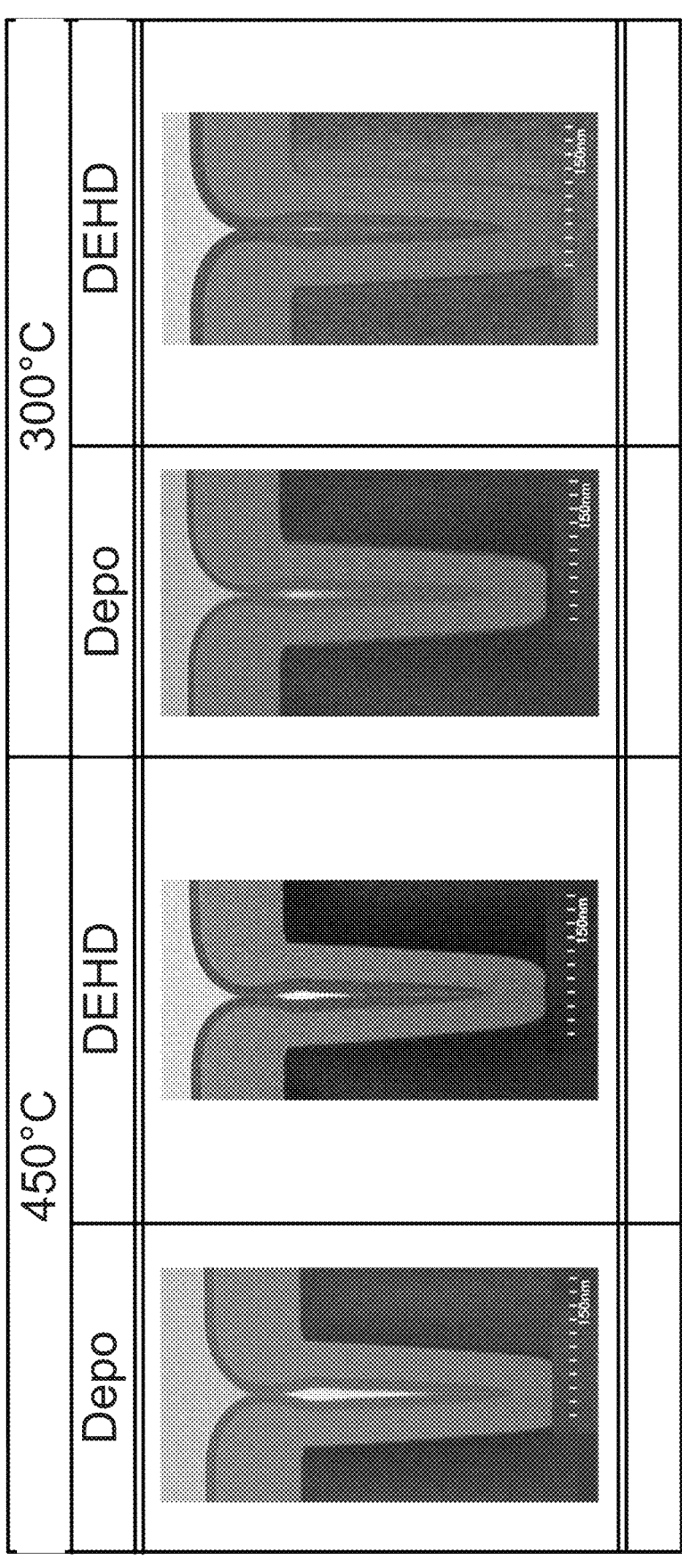

FIG. 10 illustrates STEM images of structures formed using method 700 with treatment step 710. In particular, treatment step 710 was performed using fluorine and hydrogen radicals (e.g., produced from an etchant, such as an etchant noted above and using a remote plasma) and treatment step 710 is performed as described above in connection with FIGS. 3 and 7.

FIG. 11 illustrates another multiple-chamber reactor system 1100 in accordance with examples of the disclosure. Multiple-chamber reactor system 1100 can be similar to multiple-chamber reactor systems 100, 600 described above, except multiple-chamber reactor system 1100 includes a reaction chamber configured to cure deposited silicon nitride.

In accordance with examples of the disclosure, multiple-chamber reactor system 1100 includes a first reaction chamber RC1 configured to deposit silicon nitride on a surface of a substrate to form deposited silicon nitride, a second reaction chamber RC2 configured to cure the deposited silicon nitride, and a controller. In the illustrated example, multiple-chamber reactor system 1100 further includes a third reaction chamber RC3 and a fourth reaction chamber RC4. RC3 can be the same or similar to RC1 and can be coupled to shared reactant and/or precursor sources. RC2 and RC4 can be the same or similar and can be coupled to shared etchant and/or other gas sources. Multiple-chamber reactor system 1100 also includes substrate handler SH, which can be the same or similar to and operate as described above in connection with other multiple-chamber reactor systems described herein.

In accordance with examples of the disclosure, RC1 is configured to deposit flowable silicon nitride. A temperature within RC1 during deposition of flowable silicon nitride can be less than 100° C. or less than 75° C. RC1 can be coupled to a silicon precursor source 1102, such as a silicon precursor source described above. RC1 can also be coupled to a reactant source 1106, such as a nitrogen-containing reactant source described above. RC3 can similarly be coupled to a precursor source 1104 and a reactant source 1108, which can be the same as or include the same precursor or reactant as precursor source 1102 and reactant source 1106.

In accordance with further examples, a temperature within RC2 is higher than a temperature within RC1. For example, a temperature within RC2 can be greater than 125° C., greater than 150° C., or greater than 550° C. Running different reaction chambers of a process module at different temperatures allows for desired process conditions, while mitigating temperature ramp up and/or ramp down times.

In some configurations, one of the reaction chambers, e.g., RC4, can be configured to perform a topologically selective etch as described herein. In the illustrated example, RC2 and/or RC4 can be coupled to an etchant source 1110, 1112. Additionally or alternatively, one or more of RC2, RC4 can be configured to perform a curing step. Exemplary curing steps can be or include one or more of plasma cure (e.g., $H_2$, $H_2$—He/Ar/$N_2$, gas excited by a plasma with a power of up to 600 W for up to 60 seconds), a vacuum ultraviolet radiation cure, ultraviolet radiation, and/or heat (e.g., a temperature greater than 5450° C., 500° C., 525° C., or 550° C. or other curing temperature noted herein). Curing apparatus and/or sources 1116, 1118 can be coupled to and/or at least partially integral with RC2 and/or RC4.

Controller 1114 can be configured to perform a deposition, cure, and etch process in accordance with examples of the disclosure. For example, controller 1114 can be configured to cause substrate handler SH to provide the substrate within the first reaction chamber RC1, perform a deposition cycle in the first reaction chamber RC1, use substrate handler SH to move the substrate to the second reaction chamber RC2, and perform a curing process in the second reaction chamber RC2.

The deposition cycle performed in RC1 can be the same or similar to the silicon nitride deposition process described above in connection with FIGS. 1 and 6. For example, the deposition cycle can include pulsing a silicon precursor from a silicon precursor source to the first reaction chamber RC1, providing a nitrogen-containing reactant from a nitrogen-containing reactant source to the first reaction chamber RC1, and providing a deposition plasma power to form activated species from the nitrogen-containing reactant to thereby form (e.g., flowable) deposited silicon nitride.

Next, controller 1114 can cause the substrate to be moved to RC2 and perform the curing process. As noted above, the curing process can include one or more of vacuum ultraviolet radiation, ultraviolet radiation, a plasma, and heat that can be performed in, for example, RC2 and/or RC4.

Next, controller 1114 can cause an etch process to be performed. The etch process can be performed in, for example, RC2 and/or RC4. In some cases, the etch process can be performed in the first reaction chamber RC3. The etch process can be as described above in connection with FIG. 6.

FIG. 12 illustrates a method 1200 of depositing silicon nitride in accordance with yet further embodiments of the disclosure. Method 1200 can be performed, for example, using multiple-chamber reactor system 1100.

As illustrated, method 1200 includes providing a substrate within a first reaction chamber (1202), depositing (e.g., flowable) silicon nitride on a surface of the substrate within the first reaction chamber to form deposited silicon nitride, moving the substrate to a second reaction chamber, curing the deposited silicon nitride in the second reaction chamber to form cured silicon nitride, and etching a portion of cured silicon nitride. These steps can be repeated a number of times to fill a feature, such as a recess, on a surface of the substrate. Method 1200 can be used to fill the recess from a bottom upward, provide a bottom-heavy fill, or provide a bottom only fill.

As noted above, in some cases, the step of etching and the step of curing can be performed in the same reaction chamber—e.g., RC2. In other cases, the step of etching is performed in a third reaction chamber RC3. A process module can include RC1-RC4, as described above. In such cases, a fourth reaction chamber RC4 can be used for deposition, etch, or curing as described herein.

Steps 1202-1206 and 1210 can be the same or similar to steps 202-208 (or 202-206 and 708) described above. Curing step 1208 can be as described above. In accordance with examples of the disclosure, step 1204 includes depositing initially flowable silicon nitride.

Figure 13:
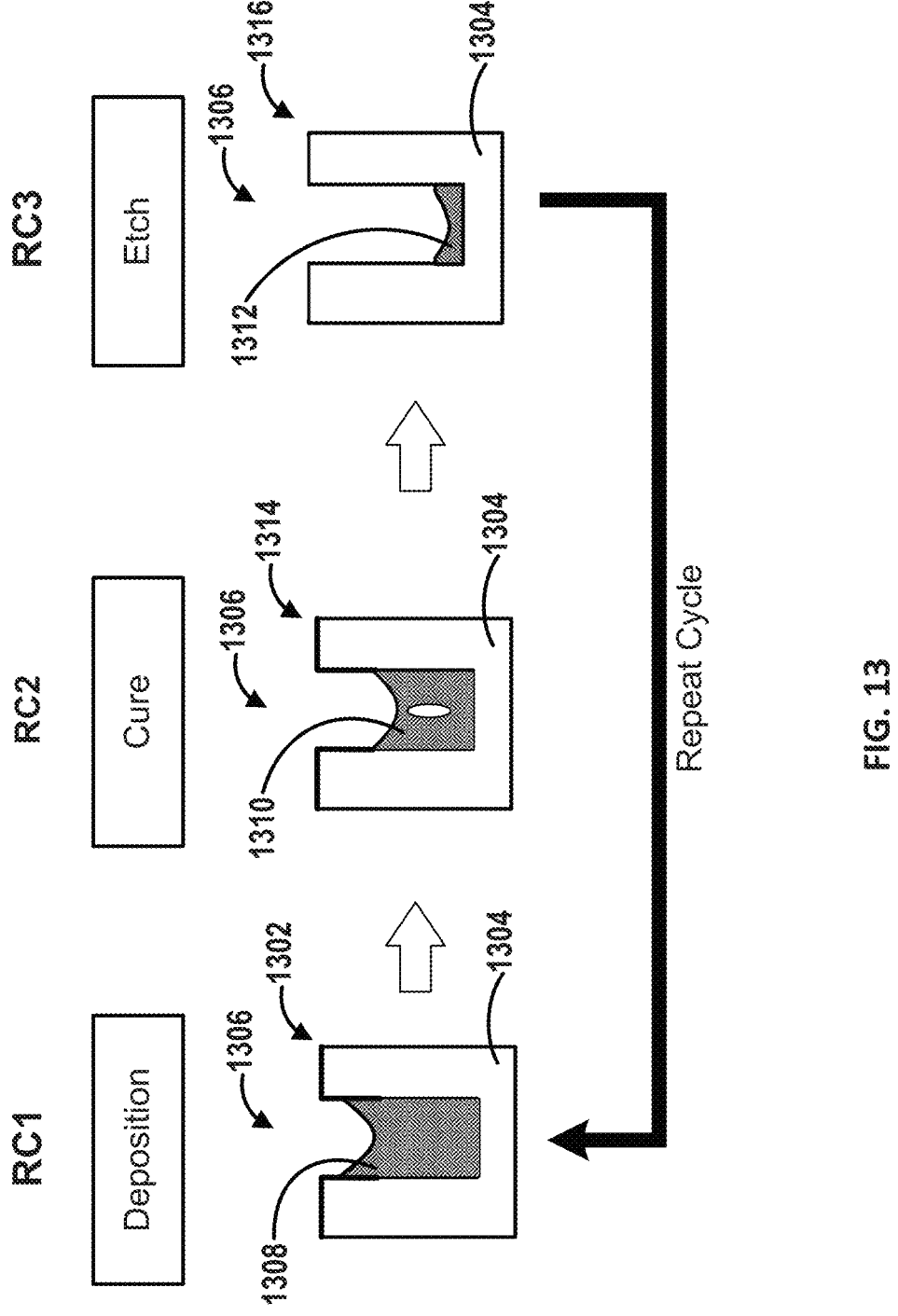

FIG. 13 illustrates a structure 1302, including a substrate 1304 having a feature 1306, such as a recess, therein and initially flowable silicon nitride 1308 deposited within feature 1306. As illustrated, after a silicon nitride deposition, substrate 1304 is moved to another reaction chamber (e.g., RC2) and a curing step is performed to form structure 1314 that includes substrate 1304 and cured silicon nitride 1310. The curing step can be or include any curing process described above.

Then, in the same reaction chamber or in another reaction chamber, a portion of the (cured) silicon nitride is etched to form structure 1316, which includes substrate 1304 and remaining silicon nitride 1312.

Turning now to FIG. 14, a reactor system 1400 in accordance with exemplary embodiments of the disclosure is illustrated. Reactor system 1400 can be used to perform one or more steps or substeps as described herein and/or to form one or more device structures or portions thereof as described herein.

Reactor system 1400 includes a pair of electrically conductive flat-plate electrodes 1414, 1418 in parallel and facing each other in an interior 1401 (reaction zone) of a reaction chamber 1402. A plasma can be excited within reaction chamber 1402 by applying, for example, plasma power from plasma power source(s) 1408 to one electrode (e.g., electrode 1418) and electrically grounding the other electrode (e.g., electrode 1414). A temperature regulator 1403 can be provided in a lower stage 1414 (the lower electrode), and a temperature of a substrate 1422 placed thereon can be kept at a desired temperature, such as the temperatures noted above. Electrode 1418 can serve as a gas distribution device, such as a shower plate or showerhead. Precursor gases, reactant gases, and a carrier or inert gas, if any, or the like can be introduced into reaction chamber 1402 using one or more gas lines (e.g., reactant gas line 1404 and precursor gas line 1406, respectively, coupled to a reactant source and a precursor source). For example, an inert gas and a reactant (e.g., as described above) can be introduced into reaction chamber 1402 using line 1404 and/or a precursor and a carrier gas (e.g., an inert gas as described above) can be introduced into the reaction chamber 1402 using line 1406. Although illustrated with two inlet gas lines 1404, 1406, reactor system 1400 can include any suitable number of gas lines.

In reaction chamber 1402, a circular duct 1420 with an exhaust line 1421 can be provided, through which gas in the interior 1401 of the reaction chamber 1402 can be exhausted to an exhaust source 1410. Additionally, a transfer chamber 1423 can be provided with a seal gas line 1429 to introduce seal gas into the interior 1401 of reaction chamber 1402 via the interior (transfer zone) of transfer chamber 1423, wherein a separation plate 1425 for separating the reaction zone 1401 and the transfer chamber 1423 can be provided (a gate valve through which a substrate is transferred into or from transfer chamber 1423 is omitted from this figure). Transfer chamber 1423 can also be provided with an exhaust line 1427 coupled to exhaust source 1410. In some embodiments, continuous flow of a carrier gas to reaction chamber 1402 can be accomplished using a flow-pass system (FPS).

Reactor system 1400 can include one or more controller(s) 1412 programmed or otherwise configured to cause one or more method steps as described herein to be conducted. Controller(s) 1412 are coupled with the various power sources, heating systems, pumps, robotics and gas flow controllers, or valves of the reactor, as will be appreciated by the skilled artisan. By way of example, controller 1412 can be configured to control gas flow of a precursor, a reactant, and an inert gas into at least one of the one or more reaction chambers to form a layer on a surface of a substrate. Controller 1412 can be further configured to provide power to form a plasma e.g., within reaction chamber 1402. Controller 1412 can be similarly configured to perform additional or alternative steps as described herein. By way of examples, controller 1412 can be configured to perform a step of treating the deposited material, etching, and/or curing as described above.

Controller 1412 can include electronic circuitry and software to selectively operate valves, manifolds, heaters, pumps and other components included in system 1400. Such circuitry and components operate to introduce precursors, reactants, and purge gases from the respective sources. Controller 1412 can control timing of gas pulse sequences, temperature of the substrate and/or reaction chamber, pressure within the reaction chamber, and various other operations to provide proper operation of the system 1400.

Controller 1412 can include control software to electrically or pneumatically control valves to control flow of precursors, reactants, and/or purge gases into and out of the reaction chamber 1402. Controller 1412 can include modules, such as a software or hardware component, e.g., a FPGA or ASIC, which performs certain tasks. A module can advantageously be configured to reside on the addressable storage medium of the control system and be configured to execute one or more processes.

In some embodiments, a dual chamber reactor (two sections or compartments for processing substrates disposed close to each other) can be used, wherein a reactant gas and a noble gas can be supplied through a shared line, whereas a precursor gas is supplied through unshared lines.

During operation of system 1400, substrates, such as semiconductor wafers, are transferred from, e.g., a substrate handling area 1423 to the reaction zone 1401. Once substrate(s) are transferred to reaction zone 1401, one or more gases, such as precursors, reactants, carrier gases, and/or purge gases, are introduced into reaction chamber 1402.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A multiple-chamber reactor system comprising:
a first reaction chamber configured to deposit silicon nitride on a surface of a substrate to form deposited silicon nitride;
a second reaction chamber configured to treat the deposited silicon nitride; and
a controller configured to:
provide the substrate within the first reaction chamber;
perform a deposition cycle in the first reaction chamber, the deposition cycle comprising:
pulsing a silicon precursor from a silicon precursor source to the first reaction chamber;
providing a nitrogen-containing reactant from a nitrogen-containing reactant source to the first reaction chamber; and
providing a deposition plasma power to form activated species from the nitrogen-containing reactant;
move the substrate to the second reaction chamber; and
perform a treatment process in the second reaction chamber, the treatment process comprising:

providing a hydrogen-containing reactant from a hydrogen reactant source to the second reaction chamber; and
providing a treatment plasma power to form activated species from the hydrogen-containing reactant.

2. The multiple-chamber reactor system of claim 1, wherein the controller is configured to execute a plurality of the deposition cycles in the first reaction chamber prior to moving the substrate to the second reaction chamber.

3. The multiple-chamber reactor system of claim 1, wherein the controller is further configured to move the substrate from the second reaction chamber to the first reaction chamber.

4. The multiple-chamber reactor system of claim 1, further comprising:
a third reaction chamber configured to deposit additional silicon nitride on a surface of treated silicon nitride; and
a fourth reaction chamber configured to treat the additional silicon nitride.

5. The multiple-chamber reactor system of claim 4, wherein the controller is configured to move the substrate from the first reaction chamber to the second reaction chamber, from the second reaction chamber to the third reaction chamber, and from the third reaction chamber to the fourth reaction chamber.

6. The multiple-chamber reactor system of claim 1, wherein the controller is further configured to ramp up a flow of the hydrogen-containing reactant after the substrate is within the second reaction chamber.

7. The multiple-chamber reactor system of claim 6, wherein the controller is further configured to ramp down the flow of the hydrogen-containing reactant before the substrate is removed from the second reaction chamber.

8. A multiple-chamber reactor system comprising:
a first reaction chamber configured to deposit silicon nitride on a surface of a substrate to form conformally deposited silicon nitride;
a second reaction chamber configured to topologically selectively etch the conformally deposited silicon nitride; and
a controller configured to:
provide the substrate within the first reaction chamber;
perform a deposition cycle in the first reaction chamber, the deposition cycle comprising:
pulsing a silicon precursor from a silicon precursor source to the first reaction chamber;
providing a nitrogen-containing reactant from a nitrogen-containing reactant source to the first reaction chamber; and
providing a deposition plasma power to form activated species from the nitrogen-containing reactant;
move the substrate to the second reaction chamber; and
perform a topologically selective etch process in the second reaction chamber, the topologically selective etch process comprising:
providing a hydrogen and/or fluorine-containing reactant from a hydrogen and/or fluorine-reactant source; and
providing a etch plasma power to form activated species from the hydrogen and/or fluorine-containing reactant.

9. The multiple-chamber reactor system of claim 8, wherein the activated species comprise fluorine radicals and hydrogen radicals.

10. A multiple-chamber reactor system comprising:

a first reaction chamber configured to deposit silicon nitride on a surface of a substrate to form deposited silicon nitride;

a second reaction chamber configured to cure the deposited silicon nitride; and a controller configured to:

provide the substrate within the first reaction chamber;

perform a deposition cycle in the first reaction chamber, the deposition cycle comprising:

pulsing a silicon precursor from a silicon precursor source to the first reaction chamber;

providing a nitrogen-containing reactant from a nitrogen-containing reactant source to the first reaction chamber; and providing a deposition plasma power to form activated species from the nitrogen-containing reactant;

move the substrate to the second reaction chamber; and perform a curing process in the second reaction chamber, the curing process comprising:

providing one or more of vacuum ultraviolet radiation, ultraviolet radiation, a plasma, and heat; and perform an etch process.

11. The multiple-chamber reactor system of claim 10, further comprising a third reaction chamber configured to perform the etch process.

12. The multiple-chamber reactor system of claim 10, wherein the etch process is performed in the second reaction chamber.

\* \* \* \* \*